(12) United States Patent
Sun et al.

(10) Patent No.: US 11,004,905 B2
(45) Date of Patent: May 11, 2021

(54) DISPLAY PANEL AND DISPLAY DEVICE (71) Applicant: BOE TECHNOLOGY GROUP CO., LTD., Beijing (CN)

(72) Inventors: Liang Sun, Beijing (CN); Tuo Sun, Beijing (CN); Xiaodan Jin, Beijing (CN); Lintao Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/358,819

(22) Filed: Mar. 20, 2019

(65) Prior Publication Data
US 2019/0237518 A1 Aug. 1, 2019

Related U.S. Application Data (63) Continuation-in-part of application No. 14/555,952, filed on Nov. 28, 2014, now abandoned.

(30) Foreign Application Priority Data

Sep. 11, 2014 (CN) .......................... 201410459909.3

(51) Int. Cl.
*G09G 3/32* (2016.01)
*H01L 27/32* (2006.01)
*H01L 51/50* (2006.01)

(52) U.S. Cl.
CPC ...... *H01L 27/3211* (2013.01); *H01L 27/3246* (2013.01); *H01L 51/5012* (2013.01)

(58) Field of Classification Search
CPC .. G09G 3/14; G09G 3/20; G09G 3/30; G09G 3/32; G09G 5/00; G09G 5/02;
(Continued)

(56) References Cited

U.S. PATENT DOCUMENTS

2003/0098917 A1 5/2003 Oda
2006/0033422 A1* 2/2006 Chao ................... H01L 27/3216
313/500
(Continued)

FOREIGN PATENT DOCUMENTS

CN 101449382 A 6/2009
CN 202736924 U 2/2013
(Continued)

OTHER PUBLICATIONS

Search Report for International Application No. PCT/CN2015/070087 dated Jun. 23, 2015.
(Continued)

*Primary Examiner* — Chanh D Nguyen
*Assistant Examiner* — Nguyen H Truong
(74) *Attorney, Agent, or Firm* — Calfee, Halter & Griswold LLP (57) ABSTRACT

A display panel includes pixels arranged in an array in a first direction and a second direction. Each pixel includes a first sub-pixel having a first light-emitting zone to emit light of a first color, a second sub-pixel having a second light-emitting zone to emit light of a second color, and a third sub-pixel having a third light-emitting zone to emit light of a third color. The first, second, and third light-emitting zones are arranged in a triangle such that the first, second, and third light-emitting zones cover respective vertices of the triangle, with one side of the triangle being substantially parallel to the first direction. Any two pixels directly adjacent in the first direction have respective patterns of first, second, and third light-emitting zones, which are substantially mirror-symmetrical to each other. Any two diagonally adjacent pixels have a substantially repeating pattern of first, second and third light-emitting zones.

18 Claims, 9 Drawing Sheets

(58) Field of Classification Search
CPC ....... H01L 27/32; H01L 27/146; H01L 51/50; H01L 51/56; H01L 21/28; H01L 33/00; G06T 1/20; G06T 5/00; H05B 33/00; H05B 33/02; H05B 37/02; H01J 17/49; G02F 1/1335

See application file for complete search history.

(56) References Cited

U.S. PATENT DOCUMENTS

| | | | |
|---|---|---|---|
| 2008/0001525 | A1 | 1/2008 | Chao et al. |
| 2009/0046108 | A1 | 2/2009 | Brown Elliott et al. |
| 2012/0049726 | A1 | 3/2012 | Yoo et al. |
| 2012/0056531 | A1 | 3/2012 | Park et al. |
| 2013/0002118 | A1 | 1/2013 | Ko |
| 2013/0113363 | A1* | 5/2013 | Hong .................. H01L 27/3218 313/498 |
| 2013/0307868 | A1* | 11/2013 | Jeong ...................... G09G 5/02 345/600 |
| 2014/0097760 | A1 | 4/2014 | Kato et al. |
| 2015/0009104 | A1 | 1/2015 | Kim et al. |
| 2015/0015466 | A1 | 1/2015 | Feng |
| 2015/0015590 | A1 | 1/2015 | Jeong |
| 2015/0015600 | A1 | 1/2015 | Yang et al. |
| 2015/0021637 | A1 | 1/2015 | Ann et al. |
| 2015/0061978 | A1 | 3/2015 | Shih |
| 2015/0155516 | A1* | 6/2015 | Yamashita .......... H01L 51/5056 257/40 |
| 2016/0276416 | A1* | 9/2016 | Ma ........................ C23C 14/042 |
| 2017/0061846 | A1* | 3/2017 | Yao ...................... G09G 3/2003 |
| 2018/0097043 | A1* | 4/2018 | Song .................. G02B 27/0172 |
| 2019/0157361 | A1* | 5/2019 | Lee ........................ H01L 27/326 |
| 2019/0237520 | A1* | 8/2019 | Tian .................... H01L 27/3218 |

FOREIGN PATENT DOCUMENTS

| | | |
|---|---|---|
| CN | 103257494 A | 8/2013 |
| CN | 103872091 A | 6/2014 |
| CN | 104009063 A | 8/2014 |
| CN | 104009066 A | 8/2014 |
| JP | 2011009093 A | 1/2011 |

OTHER PUBLICATIONS

Written Opinion for International Application No. PCT/CN2015/070087 dated Jun. 23, 2015.

First Office Action for Chinese Patent Application No. 201410459909.3 dated Jul. 21, 2016.

Second Office Action for Chinese Patent Application No. 201410459909.3 dated Jan. 3, 2017.

Third Office Action for Chinese Patent Application No. 201410459909.3 dated Jun. 22, 2017.

Fourth Action for Chinese Patent Application No. 201410459909.3 dated Dec. 1, 2017.

* cited by examiner

DISPLAY PANEL AND DISPLAY DEVICE

CROSS-REFERENCE TO RELATED APPLICATIONS

This application is a continuation-in-part of application Ser. No. 14/555,952, filed on Nov. 28, 2014 and entitled "DISPLAY PANEL, ORGANIC LIGHT EMITTING DIODE DISPLAY AND DISPLAY DEVICE", which claims the priority of Chinese Patent Application No. 201410459909.3, filed with the Chinese Patent Office on Sep. 11, 2014, the entire disclosures of which are incorporated herein by reference.

TECHNICAL FIELD

The present disclosure relates to the field of display technologies, and in particular, to a display panel and a display device.

BACKGROUND

The manufacture of organic light emitting diode (OLED) display panels is limited by the opening size of the fine metal mask and the precision of the evaporation process, rendering difficult the realization of high resolution. Moreover, in the case of high resolution, a high aperture ratio of a sub-pixel (which generally refers to a ratio of an area of the light-emitting zone of a pixel unit to an area of the pixel unit) is difficult to attain, thereby affecting the performance of the display panel, e.g. in terms of brightness.

It therefore has been a challenge in the art to increase the aperture ratio of the sub-pixel while achieving high resolution.

SUMMARY

According to an aspect of the present disclosure, a display panel is provided, comprising: a plurality of pixels arranged in an array in a first direction and a second direction intersecting the first direction, each pixel comprising: a first sub-pixel having a first light-emitting zone configured to emit light of a first color; a second sub-pixel having a second light-emitting zone configured to emit light of a second color; and a third sub-pixel having a third light-emitting zone configured to emit light of a third color. The first, second, and third light-emitting zones are arranged in a triangle such that the first, second, and third light-emitting zones respectively cover three vertices of the triangle, and one side of the triangle is substantially parallel to the first direction. The plurality of pixels are arranged such that any two pixels directly adjacent in the first direction have respective patterns of first, second, and third light-emitting zones, the respective patterns of first, second, and third light-emitting zones being substantially mirror symmetrical to each other. The plurality of pixels are arranged such that any two diagonally adjacent pixels have a substantially repeating pattern of first, second and third light-emitting zones with respect to each other. In some embodiments, the first, second, and third light-emitting zones are arranged such that centers of the first, second, and third light-emitting zones are respectively located at the three vertices of the triangle.

In some embodiments, the first, second, and third light-emitting zones are arranged such that the triangle is a substantially isosceles triangle with the one side being a base side.

In some embodiments, a distance from the center of the first light-emitting zone to the center of the second light-emitting zone is not less than a distance from the center of the first light-emitting zone to the center of the third light-emitting zone.

In some embodiments, the second light-emitting zone and the third light-emitting zone respectively cover a first vertex and a second vertex of the vertices of the triangle, the first vertex and the second vertex being respectively located at both ends of the one side of the triangle, and the first light-emitting zone covers a third vertex of the vertices of the triangle.

In some embodiments, any two first light-emitting zones adjacent in the first direction have different orientations from each other, and any two first light-emitting zones adjacent in the second direction also have different orientations from each other.

In some embodiments, the first light-emitting zone has a shape selected from a group consisting of a substantially rectangle, a substantially ellipse, a substantially circle, and a substantially square.

In some embodiments, the second light-emitting zone and the third light-emitting zone each have a substantially trapezoidal shape, the substantially trapezoidal shape having a longer base side and a shorter base side substantially parallel to each other, and the shorter base side of the second light-emitting zone and the shorter base side of the third light-emitting zone are opposite and substantially parallel to each other.

In some embodiments, the substantially trapezoidal shape is a substantially isosceles trapezoidal shape.

In some embodiments, the longer base side and the shorter base side are substantially parallel to the second direction.

In some embodiments, the second light-emitting zone and the third light-emitting zone each have a substantially triangular shape, the substantially triangular shape having a base side substantially parallel to the second direction.

In some embodiments, the first color is green, the second color is blue, and the third color is red, or the first color is green, the second color is red, and the third color is blue.

In some embodiments, the first, second, and third light-emitting zones have first, second, and third areas, respectively, and the second area is greater than the first area and greater than the third area.

In some embodiments, a distance between the second light-emitting zone and the third light-emitting zone is greater than a distance between any two second or third light-emitting zones directly adjacent in the first direction.

In some embodiments, the first light-emitting zone is disposed substantially equidistant from the second and third light-emitting zones.

In some embodiments, the first light-emitting zone has a first size in a direction parallel to a side of the second light-emitting zone opposite to the first light-emitting zone, the first light-emitting zone has a second size in a direction parallel to a side of the third light-emitting zone opposite to the first light-emitting zone, and the first size is greater than or equal to the second size.

In some embodiments, the first light-emitting zone has a substantially rectangular shape, the substantially rectangular shape having a longer side substantially parallel to the side of the second light-emitting zone opposite to the first light-emitting zone and a shorter side substantially parallel to the side of the third light-emitting zone opposite to the first light-emitting zone.

In some embodiments, the first light-emitting zone has a substantially elliptical shape, the substantially elliptical shape having a major axis substantially parallel to the side of the second light-emitting zone opposite to the first light-emitting zone and a minor axis substantially parallel to the side of the third light-emitting zone opposite to the first light-emitting zone.

In some embodiments, the display panel further comprises a base substrate on which the plurality of pixels are formed. Each of the first, second, and third sub-pixels comprises an organic light emitting diode comprising a first electrode, an organic light emitting layer, and a second electrode which are sequentially stacked in a direction away from the base substrate.

In some embodiments, the display panel further comprises a pixel defining layer that separates the first electrodes of different sub-pixels from each other.

In some embodiments, the pixel defining layer comprises a plurality of openings, the plurality of openings defining respective ones of the first, second and third light-emitting zones of the plurality of pixels.

In some embodiments, an orthographic projection of the organic light emitting layer onto the base substrate has an area larger than an area of an orthographic projection of a corresponding one of the plurality of openings onto the base substrate, such that the orthographic projection of the corresponding one of the plurality of openings falls within the orthographic projection of the organic light emitting layer.

In some embodiments, at least a portion of the organic light emitting layer is on the pixel defining layer.

In some embodiments, an orthographic projection of the first electrode onto the base substrate partially overlaps an orthographic projection of the pixel defining layer onto the base substrate.

In some embodiments, the organic light-emitting layers of any two sub-pixels directly adjacent in the first direction and having light-emitting zones configured to emit light of a same color are formed such that orthographic projections of the organic light-emitting layers onto the base substrate are in communication with each other. In some embodiments, the orthographic projections of the organic light-emitting layers that are in communication with each other have an area larger than an area of an orthographic projection of two corresponding ones of the plurality of openings onto the base substrate, such that the orthographic projection of two corresponding ones of the plurality of openings falls within the orthographic projections of the organic light-emitting layers that are in communication with each other.

In some embodiments, the orthographic projections of the organic light-emitting layers that are in communication with each other form a shape selected from a group consisting of a rounded hexagon, a rounded rectangle, a substantially ellipse, and a substantially circle.

In some embodiments, any two sub-pixels directly adjacent in the first direction and having light-emitting zones configured to emit light of a same color are connected to respective separate data lines.

In some embodiments, each of the plurality of pixels has a luminance center inside the triangle. The plurality of pixels are arranged such that a line sequentially connecting the luminance centers of the pixels arranged in the first direction is substantially parallel to the first direction, and a line sequentially connecting the luminance centers of the pixels arranged in the second direction has a zigzag shape.

According to another aspect of the present disclosure, a display device is provided comprising the display panel as described above.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

Figure 1:
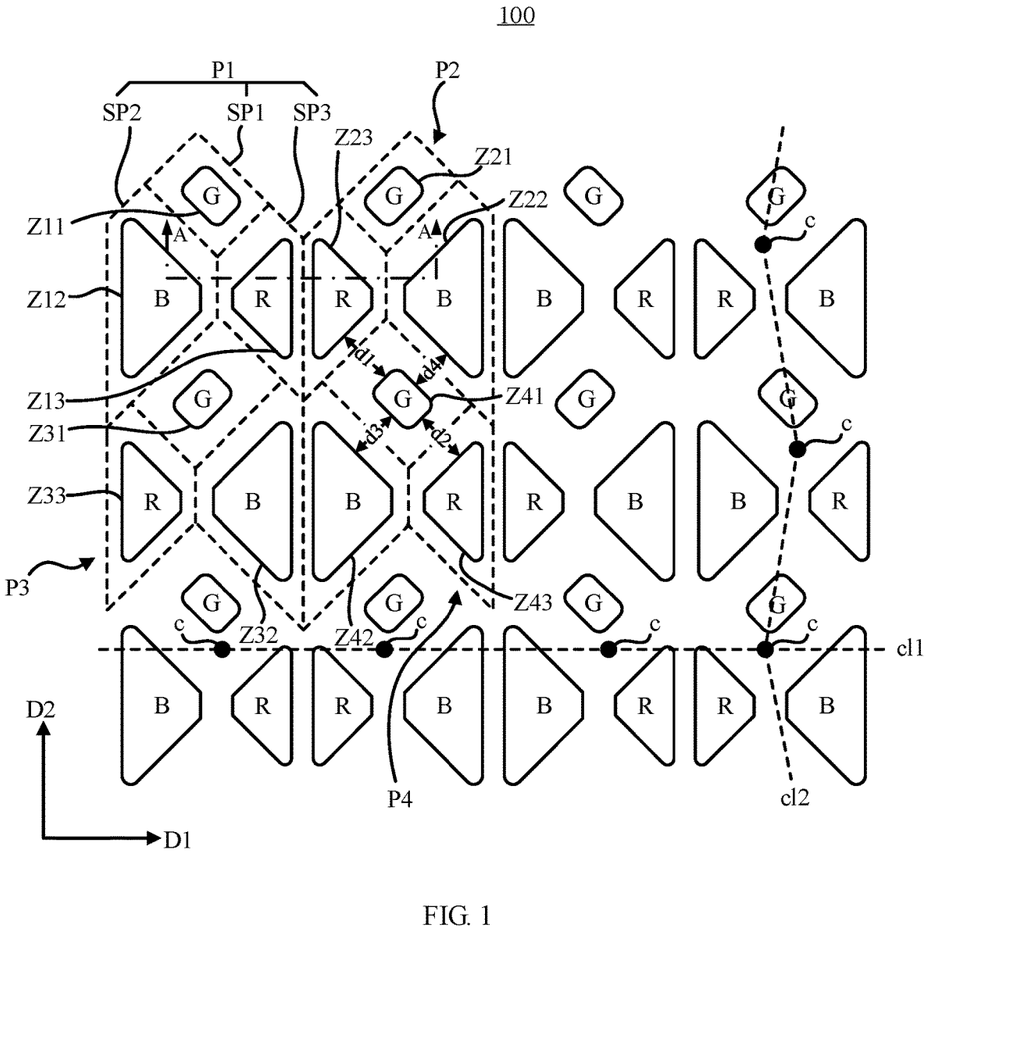
FIG. 1 is a schematic diagram showing pixel regions of a display panel according to an embodiment of the present disclosure.

FIG. 1 is a schematic diagram showing pixel regions of a display panel 100 according to an embodiment of the present disclosure.

Referring to FIG. 1, the display panel 100 includes a plurality of pixels arranged in an array in a first direction D1 and a second direction D2 intersecting (e.g., perpendicular to) the first direction D1, four of which are labeled in FIG. 1 as P1, P2, P3 and P4, respectively. Each of the pixels includes a first sub-pixel having a first light-emitting zone configured to emit light of a first color, a second sub-pixel having a second light-emitting zone configured to emit light of a second color, and a third sub-pixel having a third light-emitting zone configured to emit light of a third color. In the example of FIG. 1, the pixel P1 includes a first sub-pixel SP1 having a first light-emitting zone Z11 that emits green light, a second sub-pixel SP2 having a second light-emitting zone Z12 that emits blue light, and a third sub-pixel SP3 having a third light-emitting zone Z13 that emits red light, the pixel P2 includes a first sub-pixel SP1 having a first light-emitting zone Z21 that emits green light, a second sub-pixel SP2 having a second light-emitting zone Z22 that emits blue light, and a third sub-pixel SP3 having a third light-emitting zone Z23 that emits red light, the pixel P3 includes a first sub-pixel SP1 having a first light-emitting zone Z31 that emits green light, a second sub-pixel SP2 having a second light-emitting zone Z32 that emits blue light, and a third sub-pixel SP3 having a third light-emitting zone Z33 that emits red light, and the pixel P4 includes a first sub-pixel SP1 having a first light-emitting zone Z41 that emits green light, a second sub-pixel having a second light-emitting zone Z42 that emits blue light, and a third sub-pixel SP3 having a third light-emitting zone Z43 that emits red light. It will be understood that the first, second and third light-emitting zones themselves do not have corresponding colors, but instead emit light of corresponding colors when the display panel 100 displays an image.

Figure 2:
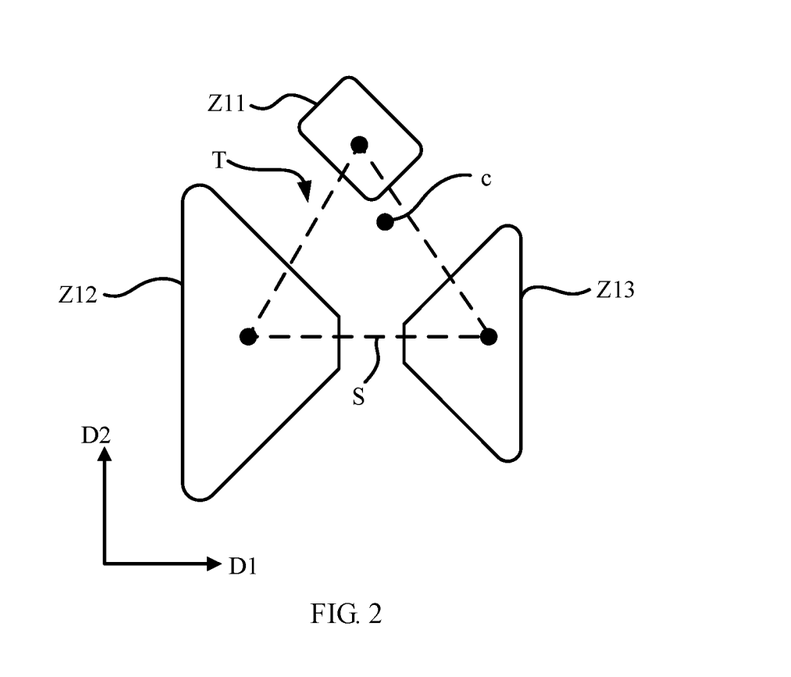
FIG. 2 is a schematic diagram showing one of the pixel regions of FIG. 1.

It will be understood that the first, second and third light-emitting zones are named for convenience of description only, and do not have a limiting effect. For example, they may not have corresponding colors or emit light of corresponding colors themselves, but instead certain structures disposed within the corresponding light-emitting zones render or emit light of corresponding colors when the display panel 100 displays images or performs a specific process. When the display panel product is not in use, the light-emitting zones are not in a light emission state but have a capability of emitting corresponding colors under certain conditions such as the structures disposed therein being applied with signals or in a light emission state. The first, second, and third light-emitting zones can thus be understood as areas having specific shapes and located in specific positions, which have the ability to emit light or to render certain colors by means of the light-emitting structures in these areas. The area where the light is emitted or the color is rendered is closely related to the physical space occupied by a light-emitting zone. For example, they may theoretically be equal, or alternatively may have a similar contour or envelope in the optical sense. FIG. 2 shows an example arrangement of the light-emitting zones of the pixel P1.

As shown in FIG. 2, the first, second and third light-emitting zones Z11, Z12 and Z13 are arranged in a triangle T such that the first, second and third light-emitting zones Z11, Z12 and Z13 cover respective vertices of the triangle T, with one side S of the triangle T being substantially parallel to the first direction D1. Here, the term "substantially" is intended to encompass the deviation from an ideal situation introduced by the manufacturing process.

Specifically, the second light-emitting zone Z12 and the third light-emitting zone Z13 respectively cover a first vertex and a second vertex of the vertices of the triangle T with the first vertex and the second vertex respectively located at both ends of the side S, and the first light-emitting zone Z11 covers a third vertex of the vertices of the triangle T. It will be understood that the arrangement of the light-emitting zones of the pixel P1 described herein in connection with FIG. 2 is also applicable to other pixels in the display panel 100.

In some embodiments, the first, second, and third light-emitting zones Z11, Z12, and Z13 are arranged such that their centers are respectively located at the three vertices of the triangle T. This provides a regular pattern of light-emitting zones, producing a desired display effect. Here, the term center may refer to a geometric center or a center of gravity of the plane shape of the corresponding light-emitting zone, or a luminance center of the corresponding light-emitting zone at the time of light emission. For a light-emitting zone, the luminance center is defined as a point of the light-emitting zone perceived by the human eye to have the highest luminance at a given grayscale. More generally, the term center may refer to a point within the light-emitting zone that has a distance to the boundary of the light-emitting zone, which distance is greater than ⅔ of the distance from the geometric center of the light-emitting zone to the boundary.

In some embodiments, the first, second, and third light-emitting zones Z11, Z12, and Z13 are arranged such that the triangle T is a substantially isosceles triangle, with the side S being a base side. This further provides a regular pattern of light-emitting zones that improves the display performance. More generally, a distance from the center of the first light-emitting zone Z11 to the center of the second light-emitting zone Z12 is not less than a distance from the center of the first light-emitting zone Z11 to the center of the third light-emitting zone Z13.

In the example of FIG. 2, the first light-emitting zone Z11 has a substantially rectangular shape. By "substantially rectangular shape" is meant in this example a rectangle having one or more rounded corners. Specifically, the substantially rectangular shape has a longer side substantially parallel to a side of the second light-emitting zone Z12 opposite to the first light-emitting zone Z11 and a shorter side substantially parallel to a side of the third light-emitting zone Z13 opposite to the first light-emitting zone Z11. It will be understood that in an embodiment in which the side of the second light-emitting zone Z12 opposite to the first light-emitting zone Z11 is as long as the side of the third light-emitting zone Z13 opposite to the first light-emitting zone Z11 (e.g., the second light-emitting zone Z12 in mirror symmetry to the third light-emitting zone Z13), the substantially rectangular shape of the first light-emitting zone Z11 would become a substantially square shape.

The second light-emitting zone Z12 and the third light-emitting zone Z13 each have a substantially trapezoidal shape. The so-called substantially trapezoidal shape in this example has a longer base side and a shorter base side that are substantially parallel to each other, as well as one or more rounded corners. The formation of the rounded corners of the first, second, and third light-emitting zones Z11, Z12, and Z13 may be due to intentional design or due to unintentional design (e.g., the manufacturing process). For example, when a light-emitting layer is evaporated and deposited using a mask, a portion of the light-emitting zone corresponding to a corner of that mask may naturally form a rounded shape rather than a desired sharp corner due to a shadow effect.

In this example, the shorter base side of the second light-emitting zone Z12 and the shorter base side of the third light-emitting zone Z13 are opposite and substantially parallel to each other. More specifically, the longer base side and the shorter base side of the second light-emitting zone Z12, together with the longer base side and the shorter base side of the third light-emitting zone Z13, are substantially parallel to the second direction D2. As will be described later, the respective light-emitting zones are defined by respective ones of the openings of a pixel defining layer in the display panel. Accordingly, the shorter base side of the second light-emitting zone Z12 is a boundary of the opening defining the second light-emitting zone Z12, and the shorter base side of the third light-emitting zone Z13 is a boundary of the opening defining the third light-emitting zone Z13. The main portions of these two boundaries are substantially parallel to each other, and two rounded corners may be formed, respectively, at both ends of each of the boundaries due to the manufacturing process. In some embodiments, the second and third light-emitting zones Z12 and Z13 may each be a substantially isosceles trapezoidal shape. In addition, although not shown in FIG. 2, the longer base sides of two second or third light-emitting zones directly adjacent in the first direction D1 are also opposite and substantially parallel to each other. The pattern of the light-emitting zones as shown in FIG. 2 facilitates a compact arrangement of the first, second, and third light-emitting zones Z11, Z12, and Z13, thus increasing the resolution of the display panel 100.

FIG. 2 further shows a luminance center c of the pixel P1 as a whole. For a pixel, the luminance center refers to a point of the pixel that is perceived by human eyes to have the highest luminance when all of the sub-pixels of the pixel are at the same given grayscale. As shown in FIG. 2, the luminance center c is located inside the triangle T. More specifically, it is close to a line connecting the center of the first light-emitting zone Z11 and the center of the third light-emitting zone Z13 and closer to the first light-emitting zone Z11 that emits green light to which the human eyes are more sensitive.

Figure 3:
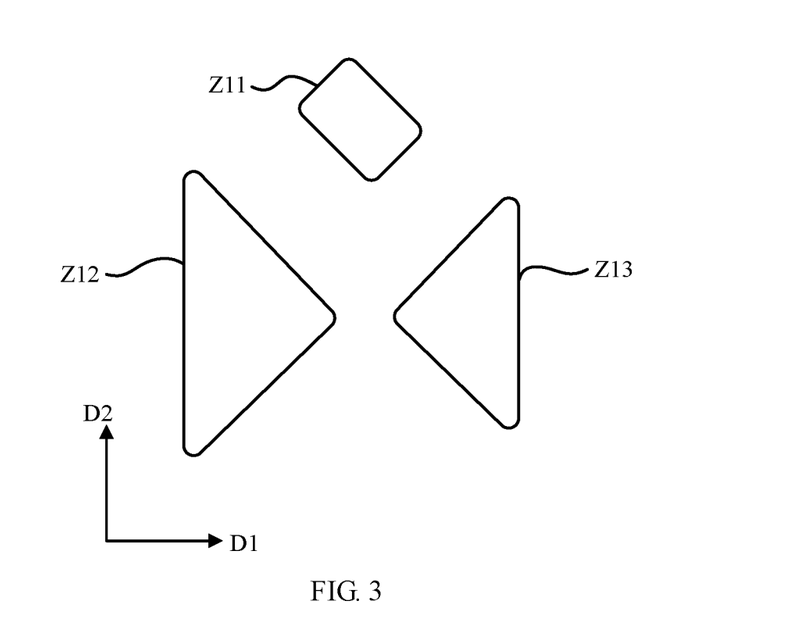
FIG. 3 is a schematic diagram showing a variation of the pixel region of FIG. 2.

FIG. 3 shows a variation of the arrangement of the light-emitting zones of the pixel P1. Referring to FIG. 3, the first light-emitting zone Z11 still has a substantially rectangular shape, and the second light-emitting zone Z12 and the third light-emitting zone Z13 now each have a substantially triangular shape having a base side substantially parallel to the second direction D2. Each of the second light-emitting zone Z12 and the third light-emitting zone Z13 has three rounded corners instead of ideal sharp corners due to, for example, the manufacturing process.

Figure 4:
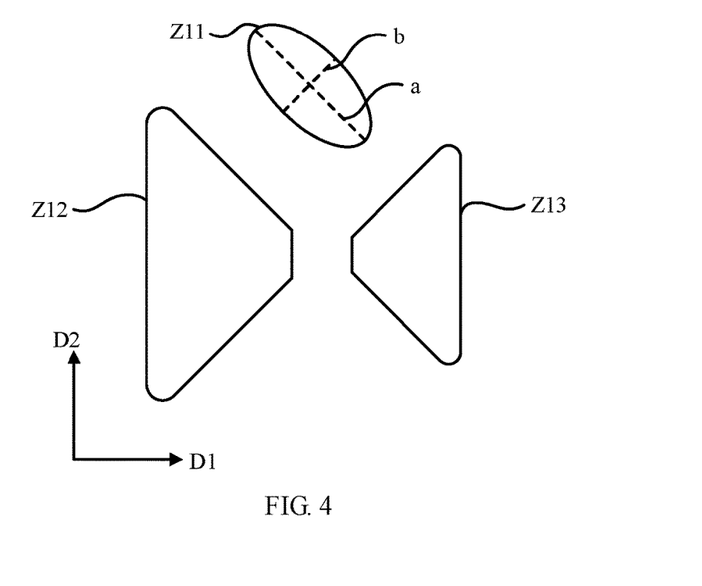
FIG. 4 is a schematic diagram showing another variation of the pixel region of FIG. 2.

FIG. 4 shows another variation of the arrangement of the light-emitting zones of the pixel P1. Referring to FIG. 4, the first light-emitting zone Z11 now has a substantially elliptical shape, and the second light-emitting zone Z12 and the third light-emitting zone Z13 each still have a substantially trapezoidal shape. Specifically, the substantially elliptical shape has a major axis a substantially parallel to a side of the second light-emitting zone Z12 opposite to the first light-emitting zone Z11 and a minor axis b substantially parallel to a side of the third light-emitting zone Z13 opposite to the first light-emitting zone Z11. It will be understood that in an embodiment in which the side of the second light-emitting zone Z12 opposite to the first light-emitting zone Z11 is as long as the side of the third light-emitting zone Z13 opposite to the first light-emitting zone Z11 (e.g., the second light-emitting zone Z12 in mirror symmetry to the third light-emitting zone Z13), the substantially elliptical shape of the first light-emitting zone Z11 would become a substantially circular shape.

More generally, in the embodiments described above in connection with FIGS. 2 to 4, the first light-emitting zone Z11 has a first size in a direction parallel to the side of the second light-emitting zone Z12 opposite to the first light-emitting zone Z11, and a second size in a direction parallel to the side of the third light-emitting zone Z13 opposite to the first light-emitting zone Z11, the first size being greater than or equal to the second size. Such an arrangement is based on the concept that the first, second and third light-emitting zones Z11, Z12 and Z13 are closely and evenly arranged.

Referring back to FIG. 1, the plurality of pixels are arranged such that any two pixels directly adjacent in the first direction D1 have respective patterns of first, second, and third light-emitting zones, which patterns are substantially mirror symmetrical to each other. For example, the pattern of first, second, and third light-emitting zones of the pixel P1 is substantially mirror-symmetrical to the pattern of first, second, and third light-emitting zones of the pixel P2. For another example, the pattern of first, second, and third light-emitting zones of the pixel P3 is also substantially mirror-symmetrical to the pattern of first, second, and third light-emitting zones of the pixel P4. Here, the phrase "A and B are substantially mirror-symmetrical" means that most (e.g., at least 70% of) regions of A and B coincide with each other after A and B are folded along a center line therebetween.

Moreover, the pixels are arranged such that any two diagonally adjacent pixels have a substantially repeating pattern of first, second and third light-emitting zones with respect to each other. For example, the pixel P1 and the diagonally adjacent pixel P4 have a substantially repeating pattern of first, second, and third light-emitting zones with respect to each other, and the pixel P2 and the diagonally adjacent pixel P3 have a substantially repeating pattern of first, second and third light-emitting zones with respect to each other. As a result, for any two pixels directly adjacent in the second direction D2, the patterns of first, second, and third light-emitting zones are horizontally inverted with respect to each other. For example, the pattern of first, second, and third light-emitting zones of the pixel P3 is horizontally inverted with respect to the pattern of first, second, and third light-emitting zones of the pixel P1. Here, the phrase "A and B having a substantially repeating pattern" may encompass 1) a situation where the patterns of A and B duplicate each other in terms of e.g. structure and shape, and 2) a situation where deviations from an ideal situation are introduced by the manufacturing process. For example, A and B may in some cases be perforated at different portions for wiring purposes, or their main bodies may correspond to each other in terms of shape and structure except that some of the layers disposed therein are slightly deformed. For example, the main pattern of an anode layer may have an extending portion to facilitate the connection to signal lines.

Embodiments of the present disclosure may realize a pixel arrangement of Real RGB as compared to a sub-pixel rendering (SPR) approach in which adjacent pixels share sub-pixels, thereby eliminating the need for signal processing and hardware circuitry for SPR purposes. Additionally, embodiments of the present disclosure may achieve process compatibility without the need for special process steps.

With continued reference to FIG. 1, in this example, any two first light-emitting zones adjacent in the first direction D1 have different orientations from each other. For example, the length direction of the first light-emitting zone Z11 in the pixel P1 is at an angle of about 45 degrees with respect to the first direction D1, and the length direction of the first light-emitting zone Z21 in the pixel P2 is also at an angle of about 45 degrees with respect to the first direction D1, such that the length direction of the first light-emitting zone Z11 is substantially perpendicular to the length direction of the first light-emitting zone Z21. In this example, any two first light-emitting zones adjacent in the second direction D2 also have different orientations from each other. For example, the length direction of the first light-emitting zone Z11 in the pixel P1 is at an angle of about 45 degrees with respect to the first direction D1, and the length direction of the first light-emitting zone Z31 in the pixel P3 is also at an angle of about 45 degrees with respect to the first direction D1, such that the length direction of the first light-emitting zone Z11 is substantially perpendicular to the length direction of the first light-emitting zone Z31. This provides a regular pattern of light-emitting zones that produces a desired display effect.

Other embodiments are also contemplated. For example, each of the first light-emitting zones may have a shape such as a substantially square, substantially elliptical or substantially circular shape.

In some embodiments, each of the first light-emitting zones is disposed substantially equidistant from diagonally adjacent ones of the second and third light-emitting zones. For example, the first light-emitting zone Z41 has a first distance d1 from the diagonally adjacent third light-emitting zone Z23, a second distance d2 from the diagonally adjacent third light-emitting zone Z43, a third distance d3 from the diagonally adjacent second light-emitting zone Z42, and a fourth distance d4 from the diagonally adjacent second light-emitting zone Z22, with the first distance d1, the second distance d2, the third distance d3, and the fourth distance d4 being substantially equal. In this context, the distance between two light-emitting zones is defined as the shortest distance between the boundaries of two openings of a pixel defining layer that define respective ones of these two light-emitting zones. This provides a pixel arrangement in which the first light-emitting zones are evenly distributed, resulting in a desired display effect.

In some embodiments, the distance between the second light-emitting zone and the third light-emitting zone that are directly adjacent in the first direction D1 is greater than the distance between any two second or third light-emitting zones that are directly adjacent in the first direction D1. For example, the distance between the second light-emitting zone Z12 and the third light-emitting zone Z13 is greater than the distance between the second light-emitting zones Z32 and Z42 or the third light-emitting zones Z13 and Z23 that are directly adjacent in the first direction D1. This provides a specific pixel arrangement that produces a desired display effect.

In the example of FIG. 1, the first light-emitting zone emits green light (G), the second light-emitting zone emits blue light (B), and the third light-emitting zone emits red light (R). Since the human eyes are sensitive to the green light, the first light-emitting zone may have a relatively small area. In some embodiments, the first light-emitting zone emitting green light has a first area, the third light-emitting zone emitting red light has a third area, and the second light-emitting zone emitting blue light has a second area larger than the first area and the third area. Other embodiments are also contemplated. For example, the second light-emitting zone and the third light-emitting zone may have substantially equal areas. In this case, the first light-emitting zone may, for example, have a circular or square shape.

In some embodiments, each of the first light-emitting zones has a side opposite to a side of a diagonally adjacent one of the second light-emitting zones, the side of the first light-emitting zone being substantially parallel to the side of the diagonally adjacent second light-emitting zone. Also, each of the first light-emitting zones has a side opposite to a side of a diagonally adjacent one of the third light-emitting zones, the side of the first light-emitting zone being substantially parallel to the side of the diagonally adjacent third light-emitting zone. For example, in the pixel P1, the lower longer side of the first light-emitting zone Z11 may be substantially parallel to the upper lateral side of the diagonally adjacent second light-emitting zone Z12, and the lower shorter side of the first light-emitting zone Z11 may be substantially parallel to the upper lateral side of the diagonally adjacent third light-emitting zone Z13. This provides a uniform sub-pixel gap that helps reduce cross-coloring.

FIG. 1 further shows the luminance centers c of the pixels arranged in the first direction D1 and the luminance centers c of the pixels arranged in the second direction D2. In this example arrangement, a line cl1 sequentially connecting the luminance centers c of the pixels arranged in the first direction D1 is substantially parallel to the first direction D1, and a line cl2 sequentially connecting the luminance centers c of the pixels arranged in the second direction D2 has a zigzag shape.

Figure 5:
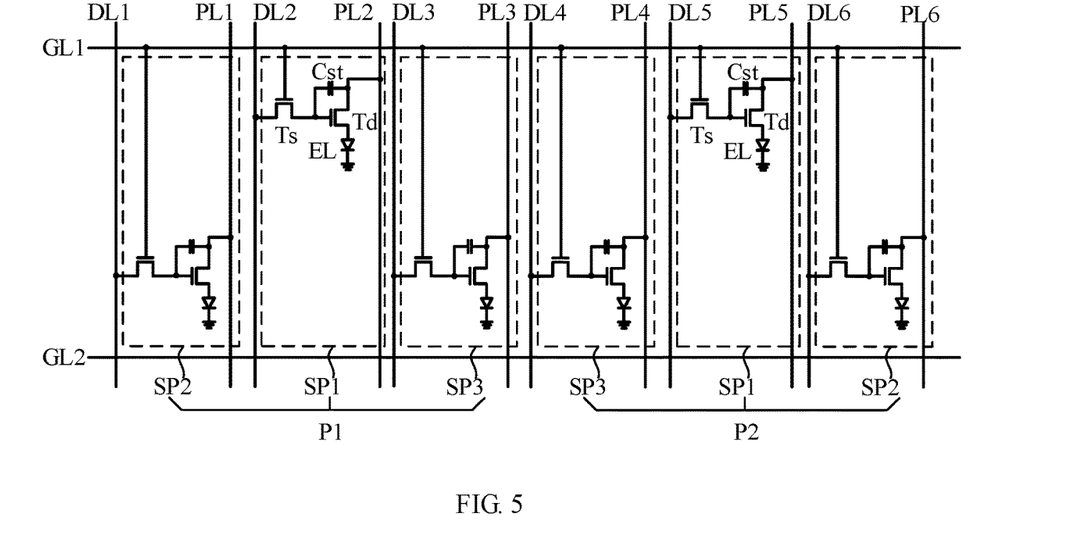
FIG. 5 is a circuit diagram of an example circuit of two pixel regions.

FIG. 5 is a circuit diagram of an example circuit of the pixels P1 and P2. Referring to FIG. 5, the display panel 100 includes first and second gate lines GL1 and GL2, first to sixth data lines DL1, DL2, DL3, DL4, DL5 and DL6, and first to sixth power supply lines PL1, PL2, PL3, PL4, PL5 and PL6. A region surrounded by the first and second gate lines GL1 and GL2, the first data line DL1, and the third power line PL3 is defined as the pixel P1, and a region surrounded by the first and second gate lines GL1 and GL2, the fourth data line DL4, and the sixth power source line PL6 is defined as the pixel P2.

The pixel P1 is divided into three sub-pixels SP1, SP2, and SP3, each of which includes a switching transistor Ts, a driving transistor Td, a storage capacitor Cst, and a light emitting diode EL. In this example, the switching transistor Ts, the driving transistor Td, the storage capacitor Cst and the light emitting diode EL in the second sub-pixel SP2 are driven by signals from the first gate line GL1 and the first data line DL1, the switching transistor Ts, the driving transistor Td, the storage capacitor Cst and the light emitting diode EL in the first sub-pixel SP1 are driven by signals from the first gate line GL1 and the second data line DL2, and the switching transistor Ts, the driving transistor Td, the storage capacitor Cst and the light emitting diode EL in the third sub-pixel SP3 are driven by signals from the first gate line GL1 and the third data line DL3.

Similarly, the pixel P2 is divided into three sub-pixels SP1, SP2, and SP3, each of which includes a switching transistor Ts, a driving transistor Td, a storage capacitor Cst, and a light emitting diode EL. In this example, the switching transistor Ts, the driving transistor Td, the storage capacitor Cst and the light emitting diode EL in the third sub-pixel SP3 are driven by signals from the first gate line GL1 and the fourth data line DL4, the switching transistor Ts, the driving transistor Td, the storage capacitor Cst and the light emitting diode EL in the first sub-pixel SP1 are driven by signals from the first gate line GL1 and the fifth data line DL5, and the switching transistor Ts, the driving transistor Td, the storage capacitor Cst and the light emitting diode EL in the second sub-pixel SP2 are driven by signals from the first and sixth data lines GL1 and DL6.

In the display panel 100, any two sub-pixels directly adjacent in the first direction D1 and having light-emitting zones emitting light of the same color are connected to respective separate data lines. For example, in FIG. 5, the two sub-pixels SP3 that are directly adjacent and have light-emitting zones emitting light of the same color are connected to the third and fourth data lines DL3 and DL4, respectively. This enables the light-emitting zones that are directly adjacent and emit light of the same color to be driven by different image data, realizing the color mode of Real RGB.

It will be understood that the circuit shown in FIG. 5 is merely exemplary and illustrative, and that in other embodiments the sub-pixels may have other forms of circuitry.

Figure 6:
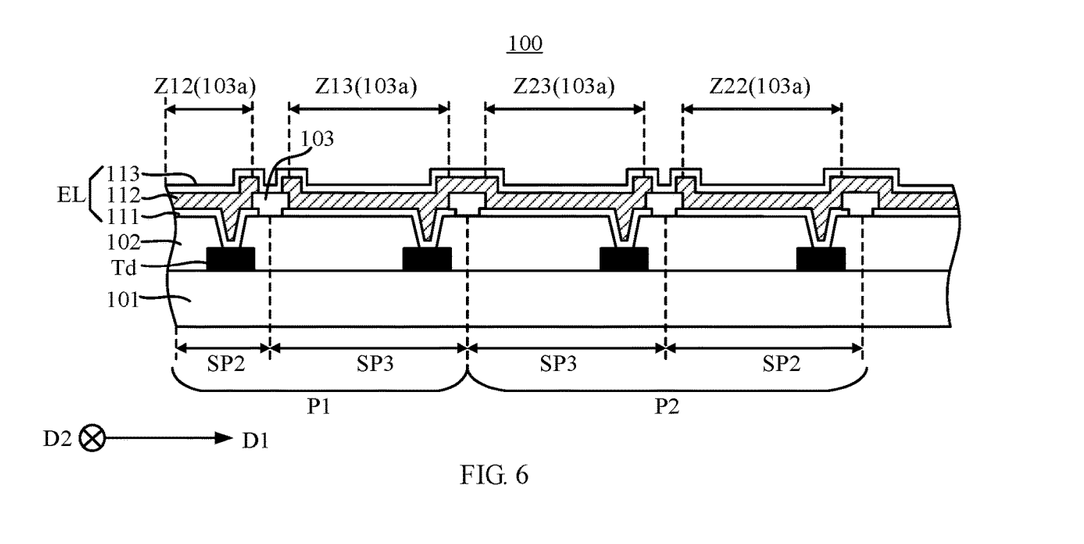
FIG. 6 is a schematic cross-sectional view of the display panel of FIG. 1 taken along line AA.

FIG. 6 is a schematic cross-sectional view of the display panel 100 taken along line AA in FIG. 1. In this example, it is assumed that each sub-pixel takes the form of the circuit as shown in FIG. 5.

Referring to FIG. 6, the display panel 100 includes a base substrate 101 on which a driving transistor Td and a switching transistor Ts (not shown) are formed in each sub-pixel region. Although not shown, each of the driving transistor Td and the switching transistor Ts includes a gate electrode, a semiconductor layer, a source electrode, and a drain electrode. For example, the driving transistor Td is of a top gate type and includes a semiconductor layer of polysilicon, a gate insulating layer on the semiconductor layer, a gate electrode on the gate insulating layer, and source and drain electrodes above the gate electrode. The center of the semiconductor layer serves as a channel, and impurities are doped to both ends of the semiconductor layer. The source and drain electrodes contact both ends of the semiconductor layer, respectively.

A passivation layer 102 is formed on the entire surface of the base substrate 101 to cover the driving transistor Td and the switching transistor Ts (not shown). The passivation layer 102 may be formed of an inorganic insulating material, for example, silicon oxide or silicon nitride, or an organic insulating material, for example, benzocyclobutene or acrylic resin.

In each of the sub-pixel regions, the organic light emitting diode EL includes a first electrode 111, an organic light emitting layer 112, and a second electrode 113 which are sequentially stacked in a direction away from the base substrate 101. The first electrode 111 may be electrically connected to the drain electrode of the driving transistor Td. The first electrode 111 serves as an anode, and the second electrode 113 serves as a cathode.

A pixel defining layer 103 is formed on the passivation layer 102 and at the boundaries of every two adjacent first electrodes 111 to delimit different sub-pixels. For example, in FIG. 6, the pixel defining layer 103 separates the organic light emitting layer 112 of the second sub-pixel SP2 from the organic light emitting layer 112 of the third sub-pixel SP3. In some embodiments, the two sub-pixels SP3 that are directly adjacent in the first direction D1 and emit light of the same color have an integrally formed organic light-emitting layer 112, as shown in FIG. 6. Although not shown, the two sub-pixels SP2 directly adjacent in the first direction D1 and emitting light of the same color may also have an integrally formed organic light-emitting layer 112. In practice, the integrally formed organic light-emitting layer 112 may be broken at a step due to the different heights of its different portions, but the orthographic projections of these portions onto the base substrate 101 are in communication with each other. More generally, the organic light-emitting layers 112 of any two sub-pixels directly adjacent in the first direction D1 and having light-emitting zone configured to emit light of the same color are formed such that the orthographic projections of these two organic light-emitting layers 112 onto the base substrate 101 are in communication with each other. The pixel defining layer 103 may be formed of an inorganic insulating material, for example, silicon oxide or silicon nitride, or an organic insulating material, for example, benzocyclobutene or acrylic resin.

In this example, the first electrodes 111 in different sub-pixel regions are separated from each other by the pixel defining layer 103, and the second electrodes 113 in different sub-pixel regions are integrally formed to cover the pixel defining layer 103 and the organic light-emitting layers 112 in different sub-pixel regions. At least a portion of the organic light emitting layer 112 is located on the pixel defining layer 103. The orthographic projection of the first electrode 111 onto the base substrate 101 partially overlaps the orthographic projection of the pixel defining layer 103 onto the base substrate 101. The pixel defining layer 103 includes a plurality of openings 103a that expose respective ones of the first electrodes 111 in the first, second, and third sub-pixels of the plurality of pixels. The respective openings 103a define respective ones of the first, second, and third light-emitting zones of the plurality of pixels. For example, the second light-emitting zone Z12 and the third light-emitting zone Z13 in the pixel P1, and the second light-emitting zone Z22 and the third light-emitting zone Z23 in the pixel P2, defined by the four openings 103a, respectively, are shown in FIG. 6.

As shown in FIG. 6, an orthographic projection of the organic light-emitting layer 112 of each sub-pixel on the substrate 101 onto the base substrate 101 has an area larger than an area of an orthographic projection of a corresponding one of the plurality of openings 103a onto the base substrate 101, such that the orthographic projection of the corresponding opening falls within the orthographic projection of the organic light emitting layer 112. It will be understood that although the openings 103a are illustrated as having vertical sidewalls in FIG. 6, this is merely illustrative. In some embodiments, each opening 103A may have a sloped sidewall such that the opening 103A tapers in a direction toward the base substrate 101. However, the orthographic projection of the portion having the largest dimension of the opening 103a onto the base substrate 101 still falls within the orthographic projection of the corresponding organic light-emitting layer 112.

In addition, for any two sub-pixels (e.g., the two sub-pixels SP3 shown in FIG. 6) that are directly adjacent in the first direction D1 and configured to emit light of the same color, their organic light-emitting layers 112 have orthographic projections onto the base substrate 101 that are in communication with each other, and the area of the orthographic projections in communication with each other is larger than the area of the orthographic projection of two corresponding openings 103a adjacent in the first direction D1 onto the base substrate 101. Accordingly, the orthographic projection of the two corresponding openings 103a falls within the orthographic projections of the organic light-emitting layer 112 that are in communication with each other.

FIGS. 7A to 7D show, in plan views, various example arrangements of the light emitting layers in the pixel regions of FIG. 1.

Reference numeral 112A indicates a light-emitting layer 112 corresponding to the first light-emitting zone (e.g., Z11) when viewed from above. Reference numeral 112A may also represent an orthographic projection of the light-emitting layer 112 onto the base substrate 101. Reference numeral 112B indicates an integrally formed light emitting layer 112 corresponding to two second light-emitting zones (e.g., Z32 and Z42) when viewed from above, which two second light-emitting zones are directly adjacent in the first direction D1. Reference numeral 112B may also represent an orthographic projection of that integrally formed light-emitting layer 112 onto the base substrate 101. Reference numeral 112C indicates an integrally formed light emitting layer 112 corresponding to two third light-emitting zones (e.g., Z13 and Z23) when viewed from above, which two third light-emitting zones are directly adjacent in the first direction D1. Reference numeral 112C may also represent an orthographic projection of that integrally formed light emitting layer 112 onto the base substrate 101.

Figure 7A:
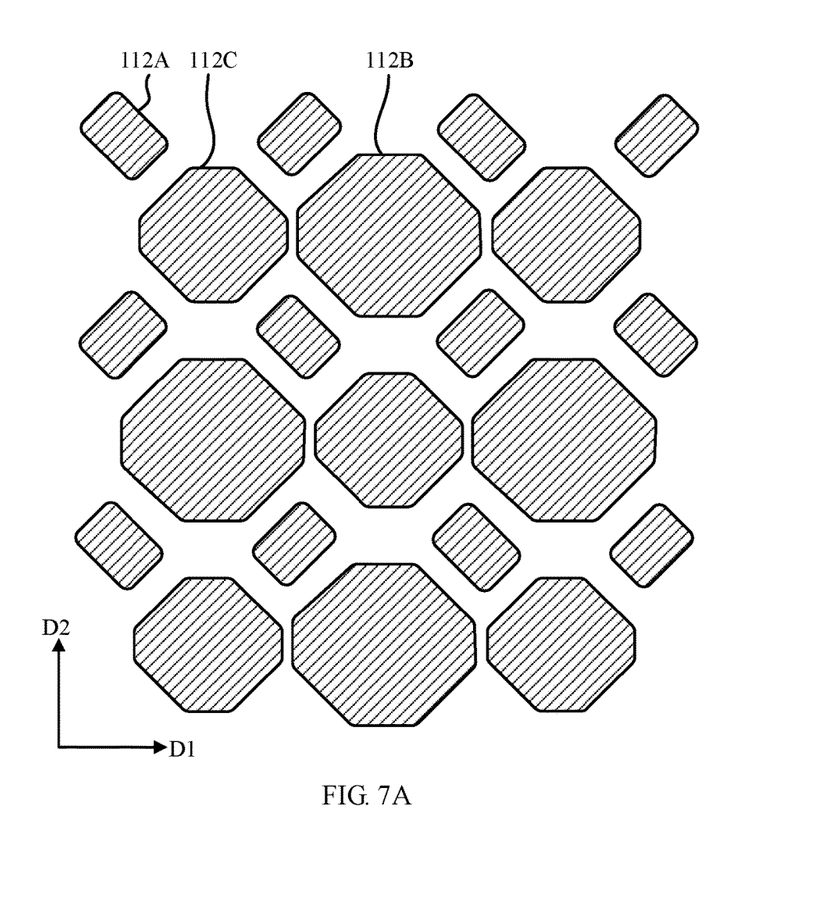
FIGS. 7A to 7D are schematic plan views showing various example arrangements of light emitting layers in the pixel regions of FIG. 1.
Figure 7B:
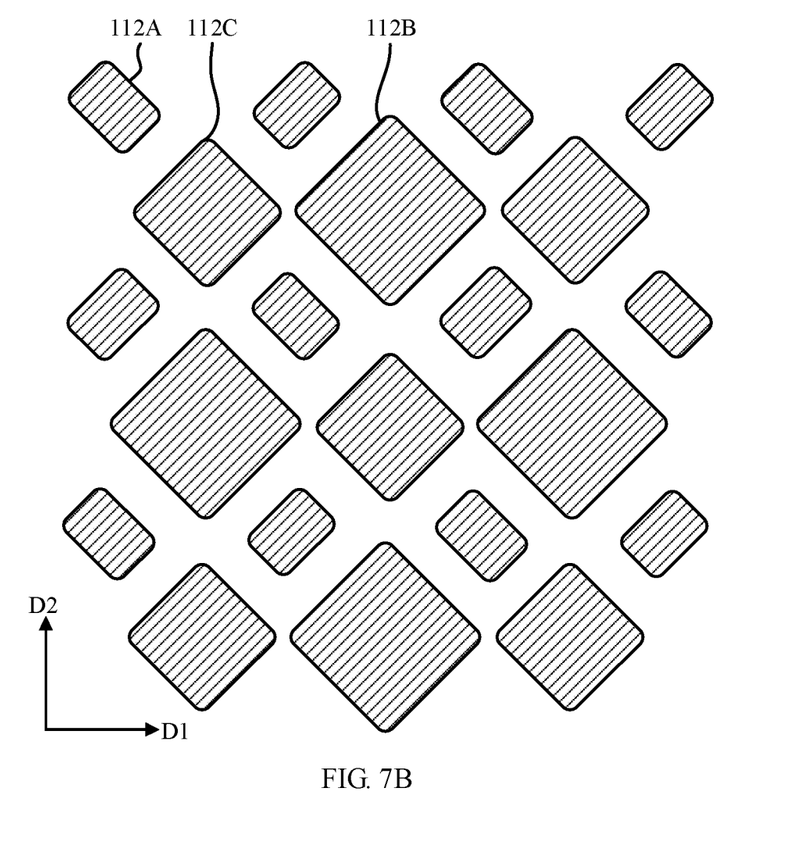
Figure 7C:
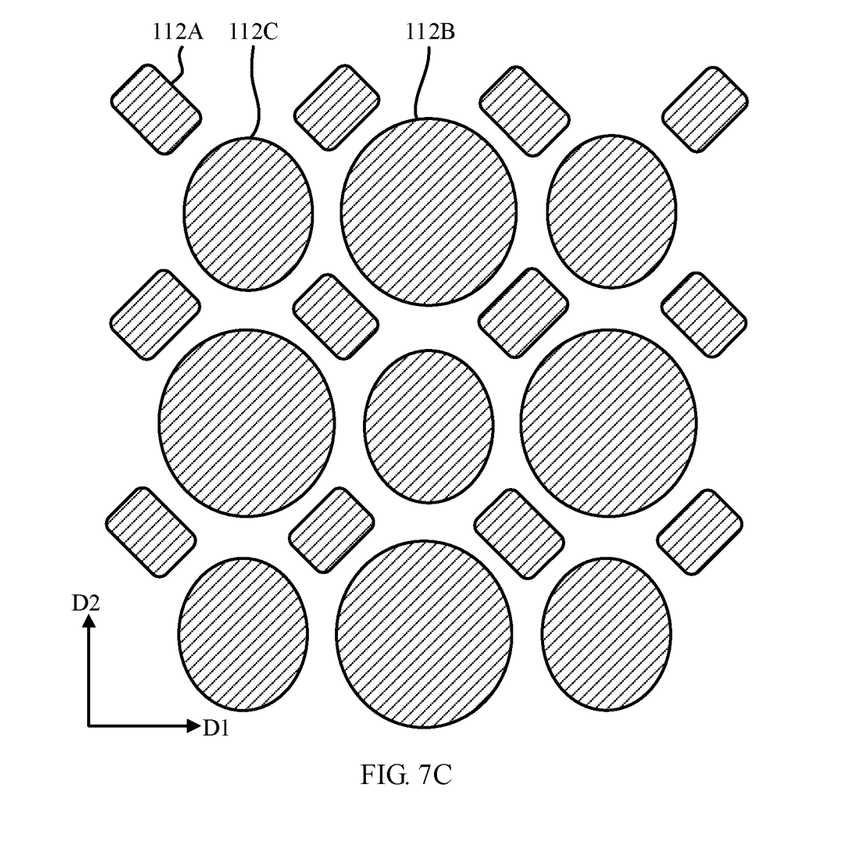
Figure 7D:
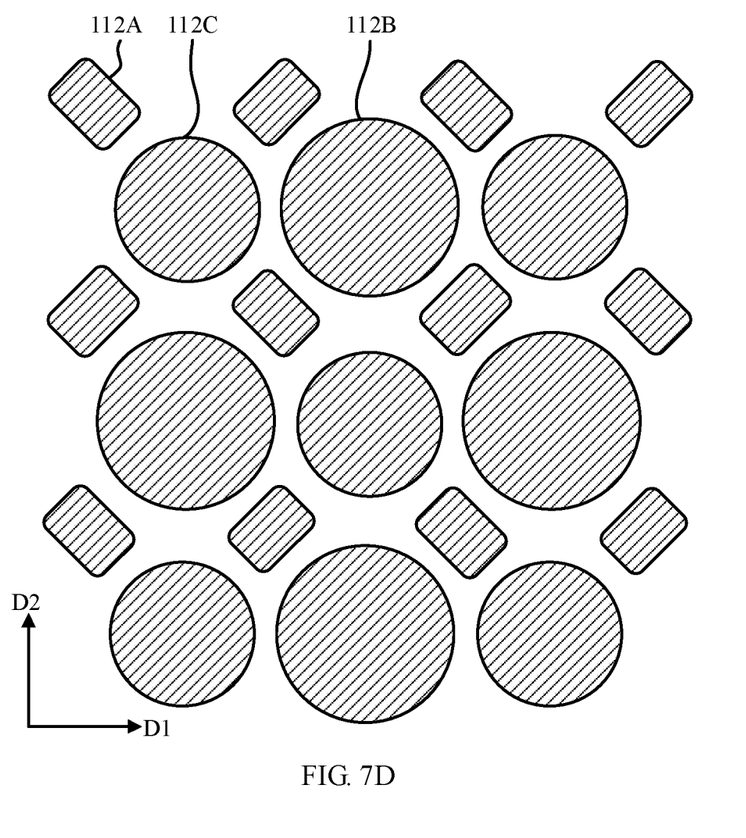

In FIG. 7A, the light-emitting layers 112B and 112C each have a shape of a rounded hexagon. In this case, the second and third light-emitting zones may each have, for example, a substantially trapezoidal shape (see FIG. 2). In FIG. 7B, the light-emitting layers 112B and 112C each have a shape of a rounded rectangle. In this case, the second and third light-emitting zones may each have, for example, a substantially triangular shape (see FIG. 3). In FIG. 7C, the light-emitting layers 112B and 112C each have a substantially elliptical shape. In FIG. 7D, the light-emitting layers 112B and 112C each have a substantially circular shape.

It will be understood that the shape of the light-emitting layer 112 when viewed from above is determined by the shape of the opening of the mask used in the evaporation process. In forming the light-emitting layers 112A, a first mask is used having a plurality of openings each corresponding to a respective one of the light-emitting layers 112A, and an evaporated first light-emitting material passes through the plurality of openings to form the light emitting layers 112A. In forming the light emitting layers 112B, a second mask is used having a plurality of openings each corresponding to a respective one of the light emitting layers 112B, and an evaporated second light-emitting material passes through the plurality of openings to form the light emitting layers 112B. In forming the light-emitting layers 112C, a third mask is used having a plurality of openings each corresponding to a respective one of the light-emitting layers 112C, and an evaporated third light-emitting material passes through the plurality of openings to form the light emitting layers 112C. Accordingly, the light-emitting layers 112A, 112B, and 112C may have any suitable shape depending on the mask used.

Figure 8:
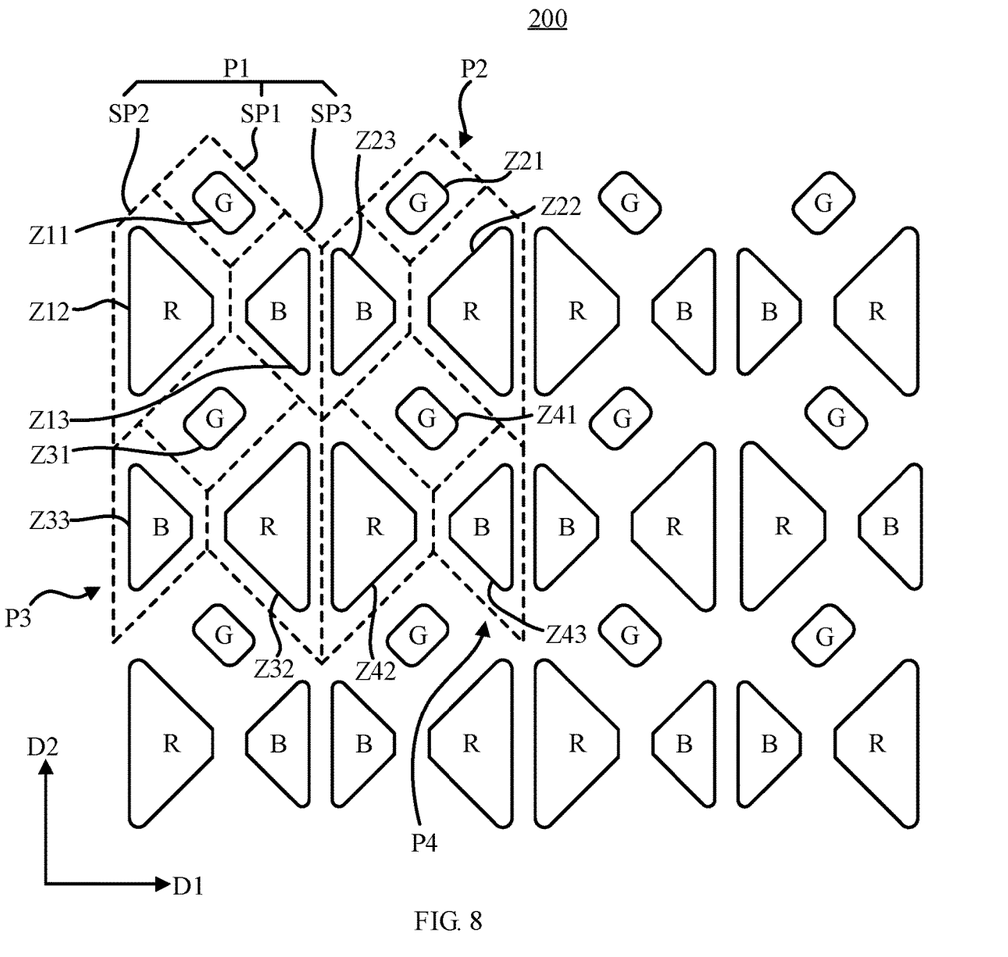
FIG. 8 is a schematic diagram showing pixel regions of a display panel according to another embodiment of the present disclosure.

FIG. 8 is a schematic diagram showing the pixel regions of a display panel 200 according to another embodiment of the present disclosure.

Referring to FIG. 8, the display panel 200 includes a plurality of pixels arranged in an array in the first direction D1 and the second direction D2, four of which are labeled P1, P2, P3, and P4, respectively. Each of the pixels includes a first sub-pixel having a first light-emitting zone configured to emit light of a first color, a second sub-pixel having a second light-emitting zone configured to emit light of a second color, and a third sub-pixel having a third light-emitting zone configured to emit light of a third color.

Unlike the display panel 100 of FIG. 1, in the display panel 200, the first light-emitting zone emits green light, the second light-emitting zone emits red light, and the third light-emitting zone emits blue light. As shown in FIG. 8, the pixel P1 includes a first sub-pixel SP1 having a first light-emitting zone Z11 that emits green light, a second sub-pixel SP2 having a second light-emitting zone Z12 that emits red light, and a third sub-pixel SP3 having a third light-emitting zone Z13 that emits blue light. The pixel P2 includes a first sub-pixel SP1 having a first light-emitting zone Z21 emitting green light, a second sub-pixel SP2 having a second light-emitting zone Z22 emitting red light, and a third sub-pixel SP3 having a third light-emitting zone Z23 emitting blue light. The pixel P3 includes a first sub-pixel SP1 having a first light-emitting zone Z31 that emits green light, a second sub-pixel SP2 having a second light-emitting zone Z32 that emits red light, and a third sub-pixel SP3 having a third light-emitting zone Z33 that emits blue light. The pixel P4 includes a first sub-pixel SP1 having a first light-emitting zone Z41 that emits green light, and a second sub-pixel SP2 having a second light-emitting zone Z42 that emits red light, a third sub-pixel SP3 having a third light-emitting zone Z43 that emits blue light.

In the example of FIG. 8, the first light-emitting zone emitting green light has a first area, the second light-emitting zone emitting red light has a second area, and the third light-emitting zone emitting blue light has a third area, with the second area larger than the first area and the third area. Other embodiments are also contemplated. For example, the second light-emitting zone and the third light-emitting zone may have substantially equal areas. In this case, the first light-emitting zone may, for example, have a circular or square shape.

Figure 9:
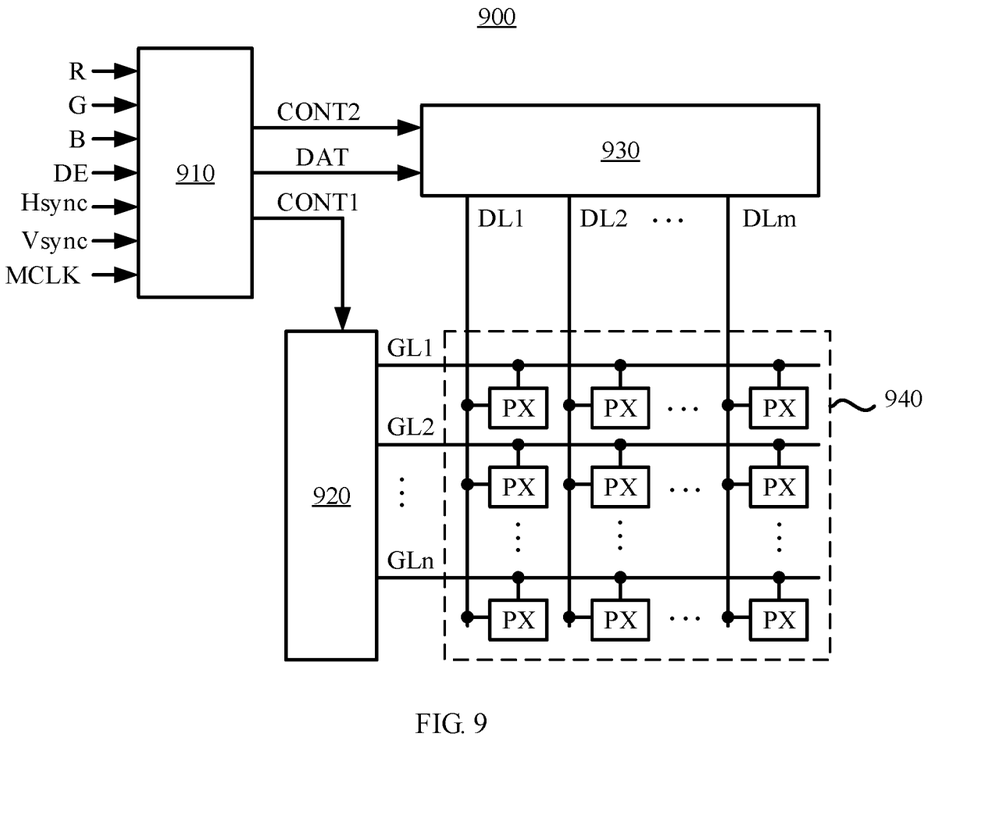
FIG. 9 is a schematic block diagram of a display device in accordance with an embodiment of the present disclosure.

FIG. 9 is a schematic block diagram of a display device 900 in accordance with an embodiment of the present disclosure. Referring to FIG. 9, the display device 900 includes a timing controller 910, a scan driver 920, a data driver 930, and a display panel 940.

The timing controller 910 receives synchronization signals and video signals R, and B from a system interface. The synchronization signals include a horizontal synchronization signal Hsync, a vertical synchronization signal Vsync, a main clock signal MCLK, and a data enable signal DE. The timing controller 910 generates a first driving control signal CONT1, a second driving control signal CONT2, and image data signals DAT based on the video signals R, and B, the horizontal synchronization signal Hsync, the vertical synchronization signal Vsync, the data enable signal DE, and the main clock signal MCLK. The timing controller 910 divides the video signals R, and B into units of frames based on the vertical synchronization signal Vsync, and divides the video signals R, and B into units of data lines based on the horizontal synchronization signal Hsync, to generate the image data signals DAT. The timing controller 910 transmits the image data signals DAT and the second drive control signal CONT2 to the data driver 930, and the first drive control signal CONT1 to the scan driver 920.

The display panel 940 includes pixels PX that are substantially arranged in a matrix. The display panel 940 may take the form of the display panel 100 or 200 described above in connection with FIGS. 1 to 8. In the display panel 940, a plurality of substantially parallel gate lines GL1 to GLn extend in a first direction, and a plurality of substantially parallel data lines DL1 to DLm extend in a second direction. The gate lines GL1 to GLn and the data lines DL1 to DLm are coupled to the pixels PX.

The scan driver 920 is coupled to the gate lines GL1 to GLn. In response to the first driving control signal CONT1, the scan driver 920 generates a plurality of scan signals S[1] to S[n], and sequentially applies the scan signals S[1]-S[n] to the gate lines GL1 to GLn. In some embodiments, the scan driver 920 may be integrated with the display panel 940.

The data driver 930 is coupled to the data lines DL1 to DLm. In response to the second driving control signal CONT2 and the image data signals DAT, the data driver 930 generates a plurality of data voltages D[1] to D[m], and applies the plurality of data voltages D[1] to D[m] to the data lines DL1 to DLm, respectively.

By way of example and not limitation, the display device 900 may be any product or component having a display function, such as a cell phone, a tablet, a television, a display, a notebook computer, a digital photo frame, a navigator, and the like.

Variations to the disclosed embodiments can be understood and effected by the skilled person in practicing the claimed subject matter, from a study of the drawings, the disclosure, and the appended claims. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:
1. A display panel, comprising:
a plurality of pixels arranged in an array in a first direction and a second direction intersecting the first direction, each pixel being consisting of:
   a first sub-pixel having a first light-emitting zone configured to emit light of a first color;
   a second sub-pixel having a second light-emitting zone configured to emit light of a second color; and
   a third sub-pixel having a third light-emitting zone configured to emit light of a third color, wherein the first, second, and third light-emitting zones are arranged in a triangle such that the first, second, and third light-emitting zones respectively cover three vertices of the triangle, and one side of the triangle is substantially parallel to the first direction, and wherein the second and third light-emitting zones respectively cover tow vertices of three vertices of the triangle, and the two vertices defines the side of the triangle which is substantially parallel to the first direction,
the display panel further comprising:
a base substrate on which the plurality of pixels are formed, wherein each of the first, second, and third sub-pixels comprises an organic light emitting diode comprising an organic light emitting layer, wherein the organic light-emitting layers of any two sub-pixels directly adjacent in the first direction and having light-emitting zones configured to emit light of a same color are formed such that orthographic projections of the organic light-emitting layers onto the base substrate are in communication with each other;
wherein the plurality of pixels are arranged such that any two pixels directly adjacent in the first direction have respective patterns of first, second, and third light-emitting zones, the respective patterns of first, second, and third light-emitting zones being substantially mirror symmetrical to each other with respect to a symmetry axis, wherein the symmetry axis is substantially parallel to the second direction,
wherein the plurality of pixels are arranged such that any two diagonally adjacent pixels have a substantially repeating pattern of first, second and third light-emitting zones with respect to each other,
wherein each of the second light-emitting zone and the third light-emitting zone has a size in the second direction larger than that in the first direction,
wherein the first light-emitting zone has a substantially rectangular shape, the substantially rectangular shape having a longer side substantially parallel to the side of the second light-emitting zone opposite to the first light-emitting zone and a shorter side substantially parallel to the side of the third light-emitting zone opposite to the first light-emitting zone, and
wherein the first, second, and third light-emitting zones have first, second, and third areas, respectively, and wherein the second area is greater than the first area and greater than the third area.

2. The display panel of claim 1, wherein the first, second, and third light-emitting zones are arranged such that centers of the first, second, and third light-emitting zones are respectively located at the three vertices of the triangle.

3. The display panel of claim 2, wherein a distance from the center of the first light-emitting zone to the center of the second light-emitting zone is not less than a distance from the center of the first light-emitting zone to the center of the third light-emitting zone.

4. The display panel of claim 1, wherein the second light-emitting zone and the third light-emitting zone respectively cover a first vertex and a second vertex of the vertices of the triangle, the first vertex and the second vertex being respectively located at both ends of the one side of the triangle, and wherein the first light-emitting zone covers a third vertex of the vertices of the triangle.

5. The display panel of claim 4, wherein the first light-emitting zone has a shape selected from a group consisting of a substantially rectangle, a substantially ellipse, a substantially circle, and a substantially square.

6. The display panel of claim 4, wherein the second light-emitting zone and the third light-emitting zone each have a substantially trapezoidal shape, the substantially trapezoidal shape having a longer base side and a shorter base side substantially parallel to each other, and wherein the shorter base side of the second light-emitting zone and the shorter base side of the third light-emitting zone are opposite and substantially parallel to each other.

7. The display panel of claim 4, wherein the second light-emitting zone and the third light-emitting zone each have a substantially triangular shape, the substantially triangular shape having a base side substantially parallel to the second direction.

8. The display panel of claim 4, wherein the first color is green, the second color is blue, and the third color is red, or wherein the first color is green, the second color is red, and the third color is blue.

9. The display panel of claim 4, wherein a distance between the second light-emitting zone and the third light-emitting zone is greater than a distance between any two second or third light-emitting zones directly adjacent in the first direction.

10. The display panel of claim 4, wherein the first light-emitting zone has a first size in a direction parallel to a side of the second light-emitting zone opposite to the first light-emitting zone, wherein the first light-emitting zone has a second size in a direction parallel to a side of the third light-emitting zone opposite to the first light-emitting zone, and wherein the first size is greater than or equal to the second size.

11. The display panel of claim 10, wherein the first light-emitting zone has a substantially elliptical shape, the substantially elliptical shape having a major axis substantially parallel to the side of the second light-emitting zone opposite to the first light-emitting zone and a minor axis substantially parallel to the side of the third light-emitting zone opposite to the first light-emitting zone.

12. The display panel of claim 1, wherein the pixel defining layer comprises a plurality of openings, the plurality of openings defining respective ones of the first, second and third light-emitting zones of the plurality of pixels.

13. The display panel of claim 12, wherein an orthographic projection of the organic light emitting layer onto the base substrate has an area larger than an area of an orthographic projection of a corresponding one of the plurality of openings onto the base substrate, such that the orthographic projection of the corresponding one of the plurality of openings falls within the orthographic projection of the organic light emitting layer.

14. The display panel of claim 1, wherein the orthographic projections of the organic light-emitting layers that are in communication with each other have an area larger than an area of an orthographic projection of two corresponding ones of the plurality of openings onto the base substrate, such that the orthographic projection of two corresponding ones of the plurality of openings falls within the orthographic projections of the organic light-emitting layers that are in communication with each other.

15. The display panel of claim 1, wherein the orthographic projections of the organic light-emitting layers that are in communication with each other form a shape selected from a group consisting of a rounded hexagon, a rounded rectangle, a substantially ellipse, and a substantially circle.

16. The display panel of claim 1, wherein each of the plurality of pixels has a luminance center inside the triangle, and wherein the plurality of pixels are arranged such that a line sequentially connecting the luminance centers of the pixels arranged in the first direction is substantially parallel to the first direction, and a line sequentially connecting the luminance centers of the pixels arranged in the second direction has a zigzag shape.

17. A display device comprising the display panel of claim 1.

18. The display panel of claim 1, wherein any two sub-pixels directly adjacent in the first direction and having light-emitting zones configured to emit light of a same color are connected to respective separate data lines.

* * * * *